(12) United States Patent
Hurwitz et al.

(10) Patent No.: US 9,608,079 B2
(45) Date of Patent: Mar. 28, 2017

(54) SEMICONDUCTOR DEVICE HAVING REDUCED DRAIN-TO-SOURCE CAPACITANCE

(71) Applicant: Newport Fab, LLC, Newport Beach, CA (US)

(72) Inventors: Paul D. Hurwitz, Irvine, CA (US); Roda Kanawati, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 14/989,968

(22) Filed: Jan. 7, 2016

(65) Prior Publication Data

US 2016/0343813 A1 Nov. 24, 2016

Related U.S. Application Data

(60) Provisional application No. 62/162,990, filed on May 18, 2015.

(51) Int. Cl.
| | |
|---|---|
| *H01L 27/088* | (2006.01) |
| *H01L 29/417* | (2006.01) |
| *H01L 29/78* | (2006.01) |
| *H01L 23/528* | (2006.01) |
| *H01L 23/522* | (2006.01) |

(52) U.S. Cl.
CPC ...... *H01L 29/41725* (2013.01); *H01L 23/528* (2013.01); *H01L 23/5226* (2013.01); *H01L 29/78* (2013.01)

(58) Field of Classification Search
CPC ........... H01L 29/0692; H01L 29/41725; H01L 29/78; H01L 23/528; H01L 23/5226

USPC ......................................................... 257/357
See application file for complete search history.

(56) References Cited

U.S. PATENT DOCUMENTS

| | | | | |
|---|---|---|---|---|
| 2003/0064574 A1* | 4/2003 | Parker | ................ | H01L 29/0692 438/558 |
| 2007/0205465 A1* | 9/2007 | Yabu | ................ | H01L 21/28518 257/355 |
| 2009/0278207 A1* | 11/2009 | Greenberg | .......... | H01L 23/4824 257/386 |
| 2012/0043609 A1* | 2/2012 | Hafez | ............. | H01L 21/823418 257/337 |
| 2013/0001686 A1* | 1/2013 | Kim | ........................ | H01L 29/78 257/336 |

(Continued)

*Primary Examiner* — Vongsavanh Sengdara
(74) *Attorney, Agent, or Firm* — Bever, Hoffman & Harms, LLP (57) ABSTRACT

A semiconductor device includes a source finger electrode coupled to a source region in a semiconductor die, a drain finger electrode coupled to a drain region in the semiconductor die, where the source finger electrode includes at least one isolated segment and a main segment having a first portion and a second portion narrower than the first portion, whereby the source finger electrode reduces a drain-to-source capacitance of the semiconductor device. A common source rail is electrically coupled to the at least one isolated segment and the main segment of the source finger electrode. The drain finger electrode includes at least one isolated segment and a main segment having a first portion and a second portion narrower than the first portion. A common drain rail is electrically coupled to the at least one isolated segment and the main segment of the drain finger electrode.

20 Claims, 5 Drawing Sheets

(56) References Cited

U.S. PATENT DOCUMENTS

| | | | |
|---|---|---|---|
| 2014/0002143 A1* | 1/2014 | Ohtsuka | H01L 29/1087 327/108 |
| 2014/0103434 A1* | 4/2014 | Lu | H01L 29/41758 257/346 |
| 2016/0141240 A1* | 5/2016 | Saka | H01L 23/4824 257/401 |

* cited by examiner

SEMICONDUCTOR DEVICE HAVING REDUCED DRAIN-TO-SOURCE CAPACITANCE

The present application claims the benefit of and priority to a provisional patent application entitled "Coff Improvement in RF switches," Ser. No. 62/162,990 filed on May 18, 2015. The disclosure in this provisional application is hereby incorporated fully by reference into the present application.

BACKGROUND

For various semiconductor devices, such as radio frequency ("RF") switches in bulk silicon or semiconductor on insulator ("SOI") structures, power loss and switching speed are two important parameters related to device performance. Power loss is determined, in part, by an on-state resistance (Ron) of the semiconductor device, while switching speed is determined, in part, by an off-state capacitance (Coff) of the semiconductor device. The on-state resistance includes the drain-to-source resistance of the semiconductor device in an on state, which partially depends on the resistance of the drain and source metals (e.g., source and drain electrodes) and the device layout area. The off-state capacitance includes the drain-to-source capacitance of the semiconductor device in an off state, which may be attributed to an off-state parasitic coupling between the drain and source metals.

It is desirable for a semiconductor device, such as an RF switch, to have a low on-state resistance to reduce power loss, and a low off-state capacitance to improve switching speed. However, there is a trade-off between the two parameters. For example, the on-state resistance can be reduced by increasing the width of the source and drain metals, but the off-state capacitance can also be adversely increased due to the greater metalization width and device layout area.

Accordingly, there is a need to provide a semiconductor device, such as an RF switch, with a reduced drain-to-source capacitance without substantially compromising the on-state resistance of the semiconductor device.

SUMMARY

The present application is directed to a semiconductor device having a reduced drain-to-source capacitance, substantially as shown in and/or described in connection with at least one of the figures, and as set forth in the claims.

DETAILED DESCRIPTION

The following description contains specific information pertaining to implementations in the present application. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1:
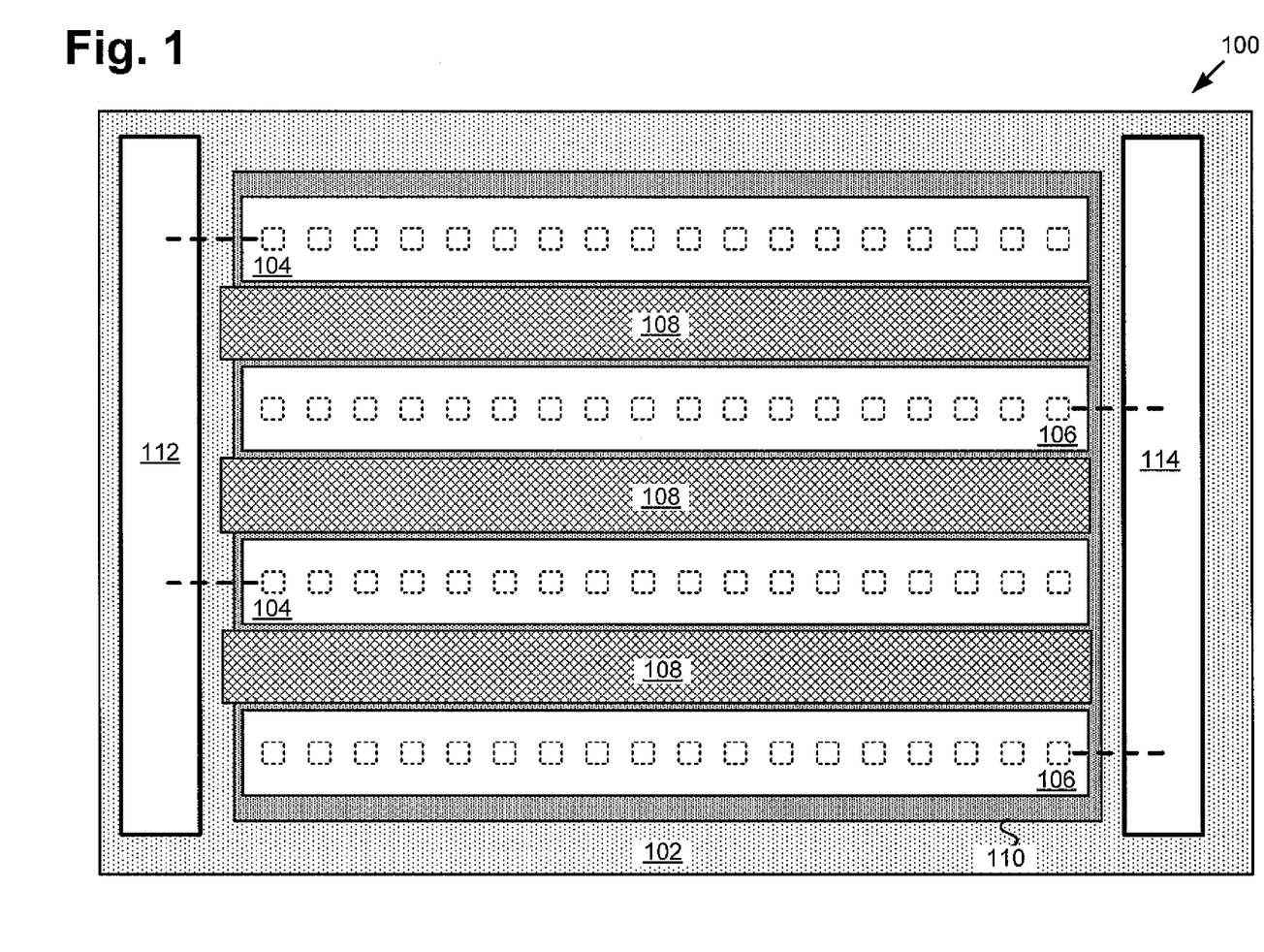
FIG. 1 illustrates a top plan view of a portion of a conventional semiconductor device.

FIG. 1 illustrates a top plan view of a portion of a conventional semiconductor device. Semiconductor device 100 includes active region 110 in semiconductor die 102, source finger electrodes 104, drain finger electrodes 106, and gate finger electrodes 108. Semiconductor device 100 also includes source pad 112 electrically coupled to source finger electrodes 104, and drain pad 114 electrically coupled to drain finger electrodes 106. It is noted that the electrical coupling of source finger electrodes 104 and drain finger electrodes 106 to respective source pad 112 and drain pad 114 is shown by dashed lines because these connections may be formed using one or more additional metal layers not shown in FIG. 1. It is further noted that semiconductor device 100 may include one or more gate pads (not explicitly shown in FIG. 1) electrically coupled to gate finger electrodes 108.

As illustrated in FIG. 1, source finger electrodes 104 and drain finger electrodes 106 are implemented in an interdigitated pattern such that each gate finger electrode 108 is disposed between an adjacent pair of source finger electrode 104 and drain finger electrode 106. Gate finger electrode 108 may be coupled to active region 110 of semiconductor die 102, for example, through a dielectric layer (not explicitly shown in FIG. 1). It is noted that semiconductor device 100 may include a source region (not explicitly shown in FIG. 1) in semiconductor die 102 under each source finger electrode 104, and electrically coupled to the corresponding source finger electrode 104 by source contacts shown by dashed squares. Similarly, it is noted that semiconductor device 100 may also include a drain region (not explicitly shown in FIG. 1) in semiconductor die 102 under each drain finger electrode 106, and electrically coupled to the corresponding drain finger electrode 106 by drain contacts shown by dashed squares.

As illustrated in FIG. 1, each source finger electrode 104 has a continuous body and a substantially constant width along the entire length of source finger electrode 104. Each drain finger electrode 106 also has a continuous body and a substantially constant width along the entire length of drain finger electrode 106. Thus, source finger electrodes 104 and drain finger electrodes 106 can be capacitively coupled through the entire length of the device layout area. As a result, the metallization structure of semiconductor device 100 having source finger electrodes 104 and drain finger electrodes 106 may contribute to approximately 40% of the total off-state capacitance of semiconductor device 100, leading to reduced switching speeds. Although reducing the overall width of source finger electrodes 104 and drain finger electrodes 106 may reduce the drain-to-source capacitance, it may also adversely increase the on-state resistance of semiconductor device 100, leading to greater power loss, for example, under high frequency switching operation. In accordance with implementations of the present application, various approaches are described, which can be utilized alone or in any combination to reduce the drain-to-source capacitance without substantially compromising the on-state resistance, amongst other advantages.

Figure 2A:
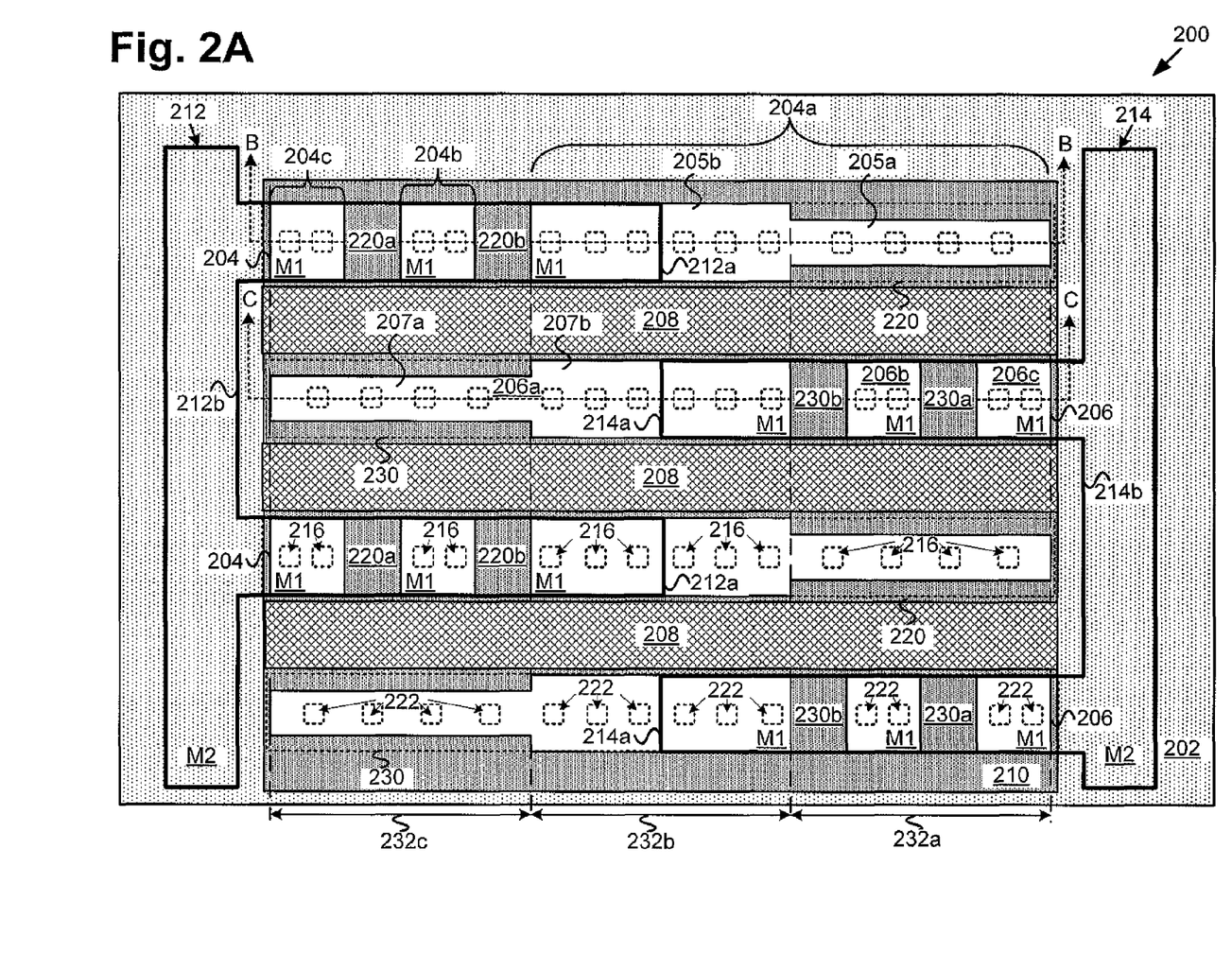
FIG. 2A illustrates a top plan view of a portion of an exemplary semiconductor device having a metalization structure enabling reduced drain-to-source capacitance, in accordance with an implementation of the present application.

Turning to FIG. 2A, FIG. 2A illustrates a top plan view of a portion of an exemplary semiconductor device having a metalization structure enabling reduced drain-to-source capacitance, in accordance with an implementation of the present application. In FIG. 2A, semiconductor device 200 includes source regions 220 and drain regions 230 in active region 210 of semiconductor die 202. Semiconductor die 202 may include any suitable semiconductor material, such as silicon, silicon-on-insulator (SOT), silicon-on-sapphire (SOS), silicon carbide, silicon germanium or the like. Semiconductor device 200 also includes source finger electrodes 204 over corresponding source regions 220, drain finger electrodes 206 over corresponding drain regions 230, and gate finger electrodes 208 over active region 210 between each adjacent source region 220 and drain region 230. Source finger electrodes 204 and drain finger electrodes 206 are substantially parallel to one another, and implemented in an interdigitated pattern.

In the present implementation, source finger electrodes 204 are formed in a metal layer, such as metal one (M1) layer, over semiconductor die 202, and electrically coupled to corresponding source regions 220 in semiconductor die 202 through source contacts 216. For example, source finger electrodes 204 may be formed on a dielectric layer (e.g., dielectric layer 226a in FIG. 2B) over semiconductor die 202, where source contacts 216 extend through the dielectric layer and electrically couple source finger electrodes 204 to corresponding source regions 220 in semiconductor die 202.

As illustrated in FIG. 2A, each source finger electrode 204 includes main segment 204a and isolated segments 204b and 204c. Main segment 204a of each source finger electrode 204 includes portion 205a and portion 205b, where portion 205b has a normal width and portion 205a has a reduced width that is narrower than the normal width of portion 205b. In another implementation, portion 205a of main segment 204a may have a gradually decreasing width toward the tip of source finger electrode 204. Isolated segments 204b and 204c of each source finger electrode 204 have the same width as the normal width of portion 205b of main segment 204a, and are physically separated from main segment 204a. Portions 205a and 205b of main segment 204a and isolated segments 204b and 204c are each electrically coupled to source region 220 through source contacts 216.

In contrast to semiconductor device 100 in FIG. 1, where source finger electrodes 104 each have a continuous body and a substantially constant width through the entire length of the source finger electrode, each source finger electrode 204 of semiconductor device 200 includes main segment 204a and one or more isolated segments 204b and 204c, where main segment 204a has portion 205b with a normal width and portion 205a with a reduced width. Portion 205a with the reduced width can effectively reduce the drain-to-source capacitance without substantially increasing the on-state resistance, thereby reducing the off-state capacitance of semiconductor device 200. In addition, by segmenting each source finger electrode 204 into main segment 204a and one or more isolated segments 204b and 204c, implementations of the present application result in bare active regions 220a and 220b, where no source contact, metal one (M1) layer or conductive via is formed thereabove, thereby further reducing the drain-to-source capacitance.

As illustrated in FIG. 2A, as portion 205a of source finger electrode 204 is laid out across from isolated segments 206b and 206c of drain finger electrode 206, the drain-to-source capacitive coupling is substantially reduced due to the reduced width of portion 205a of source finger electrode 204 and isolated segments 206b and 206c of drain finger electrode 206. For example, bare active region 230a between isolated segments 206b and 206c is free of drain contacts and metal one (M1) layer, as isolated segments 206b and 206c are separated by dielectric material. Bare active region 230b between isolated segment 206b and main segment 206a is also free of drain contacts and metal one (M1) layer, as isolated segment 206b and main segment 206a are separated by dielectric material. As a result, the drain-to-source coupling between source finger electrode 204 and drain finger electrode 206 is substantially zero in bare active regions 230a and 230b.

As illustrated in FIG. 2A, source finger electrodes 204 are electrically coupled to common source rail 212, which is formed on a different metal plane (e.g., metal two (M2) layer) than source finger electrodes 204 (e.g., metal one (M1) layer). Common source rail 212 includes source contact fingers 212a electrically and mechanically coupled to source runner 212b. Each source contact finger 212a extends over and electrically couples to isolated segments 204b and 204c and portion 205b of main segment 204a of corresponding source finger electrode 204, for example, through conductive vias (not explicitly shown in FIG. 2A).

In the present implementation, each source contact finger 212a has a length that is approximately half of the length of each source finger electrode 204. As illustrated in FIG. 2A, each source contact finger 212a extends approximately half way through each source finger electrode 204. Each source contact finger 212a has a substantial constant width throughout the entire length thereof. In the present implementation, source contact finger 212a may have a width substantially equal to the width of portion 205b of main segment 204a of source finger electrode 204. In another implementation, source contact finger 212a may be wider or narrower than portion 205b of main segment 204a of source finger electrode 204. Since common source rail 212 and source finger electrodes 204 are formed on two different metal layers, the on-state resistance of semiconductor device 200 can be substantially reduced.

In the present implementation, drain finger electrodes 206 are formed in a metal layer, such as metal one (M1) layer, over semiconductor die 202, and electrically coupled to corresponding drain regions 230 in semiconductor die 202 through drain contacts 222. For example, drain finger electrodes 206 may be formed on a dielectric layer (e.g., dielectric layer 226a in FIG. 2C) over semiconductor die 202, where drain contacts 222 extend through the dielectric layer and electrically couple drain finger electrodes 206 to corresponding drain regions 230 in semiconductor die 202.

As illustrated in FIG. 2A, each drain finger electrode 206 includes main segment 206a and isolated segments 206b and 206c. Main segment 206a of each drain finger electrode 206 includes portion 207a and portion 207b, where portion 207b has a normal width and portion 207a has a reduced width that is narrower than the normal width of portion 207b. In another implementation, portion 207a of main segment 206a may have a gradually decreasing width toward the tip of drain finger electrode 206. Isolated segments 206b and 206c of each drain finger electrode 206 have the same width as the normal width of portion 207b of main segment 206a, and are physically separated from main segment 206a. Portions 207a and 207b of main segment 206a and isolated segments 206b and 206c are each electrically coupled to drain region 230 through drain contacts 222.

In contrast to semiconductor device 100 in FIG. 1, where drain finger electrodes 106 each have a continuous body and a substantially constant width through the entire length of the drain finger electrode, each drain finger electrode 206 of semiconductor device 200 includes main segment 206a and one or more isolated segments 206b and 206c, where main segment 206a has portion 207b with a normal width and portion 207a with a reduced width.

As illustrated in FIG. 2A, drain finger electrodes 206 are each electrically coupled to common drain rail 214, which is on a different metal plane (e.g., metal two (M2) layer) than drain finger electrodes 206 (e.g., metal one (M1) layer). Common drain rail 214 includes drain contact fingers 214a electrically and mechanically coupled to drain runner 214b. Each drain contact finger 214a extends over and electrically couples to isolated segments 206b and 206c and portion 207b of main segment 206a of corresponding drain finger electrode 206 through conductive vias (not explicitly shown in FIG. 2A).

In the present implementation, each drain contact finger 214a has a length that is approximately half of the length of each drain finger electrode 206. As illustrated in FIG. 2A, each drain contact finger 214a extends approximately half way through each drain finger electrode 206. Each drain contact finger 214a has a substantial constant width throughout the entire length thereof. In the present implementation, drain contact finger 214a may have a width substantially equal to the width of portion 207b of main segment 206a of drain finger electrode 206. In another implementation, drain contact finger 214a may be wider or narrower than portion 207b of main segment 206a of drain finger electrode 206. Since common drain rail 214 and drain finger electrodes 206 are formed on two different metal layers, the on-state resistance of semiconductor device 200 can be substantially reduced.

In the present implementation, when semiconductor device is on, current is the smallest at the tip of drain finger electrode 206 away from common drain rail 214, and gradually increases toward the beginning (e.g., isolated segment 206c) of drain finger electrode 206. Since the voltage drop due to the product of current and resistivity is the smallest in portion 207a of drain finger electrode 206, reducing the width of metal one (M1) layer in portion 207a can effective reduce the drain-to-source capacitance without substantially affecting the on-state resistivity of semiconductor device 200. As the current becomes greater toward the beginning to drain finger electrode 206, drain finger electrode 206 returns to the normal width to handle the increased current. At approximately midpoint of portion 207b of main segment 206a, as the current becomes even greater, drain contact fingers 214a is utilized (by connection through conductive vias 224e, 224f and 224g in FIG. 2C) to assist drain finger electrode 206 in metal one (M1) layer to carry the increased current. For the remaining portion of drain finger electrode 206, only isolated segments, such as isolated segments 206b and 206c, are used as a means to connect drain contact fingers 214a in metal two (M2) layer to drain finger electrode 206. As a result, bare active regions 230a and 230b are free of drain contacts, metal one (M1) layer and conductive vias, thereby reducing the capacitive coupling to metal one (M1) regions in an adjacent source finger electrode, such as portion 205a of main segment 204a of source finger electrode 204.

As illustrated in FIG. 2A, as portion 207a of drain finger electrode 206 is laid out across from isolated segments 204b and 204c of source finger electrode 204, the drain-to-source capacitive coupling is substantially reduced due to the reduced width of portion 207a of drain finger electrode 206 and isolated segments 204b and 204c of source finger electrode 204. For example, bare active region 220a between isolated segments 204b and 204c is free of source contacts and metal one (M1) layer, as isolated segments 204b and 204c are separated by dielectric material. Bare active region 220b between isolated segment 204b and main segment 204a is also free of source contacts and metal one (M1) layer, as isolated segment 204b and main segment 204a are separated by dielectric material. As a result, the drain-to-source coupling between source finger electrode 204 and drain finger electrode 206 is substantially zero in bare active regions 220a and 220b. In addition, since source contact fingers 212a only extend half way through the entire length of each source finger electrode 204, and drain contact fingers 214a only extend half way through the entire length of each drain finger electrode 206, the capacitive coupling of source contact fingers 212a and drain contact fingers 214a on metal two (M2) layer is substantially minimized, for example.

Figure 2B:
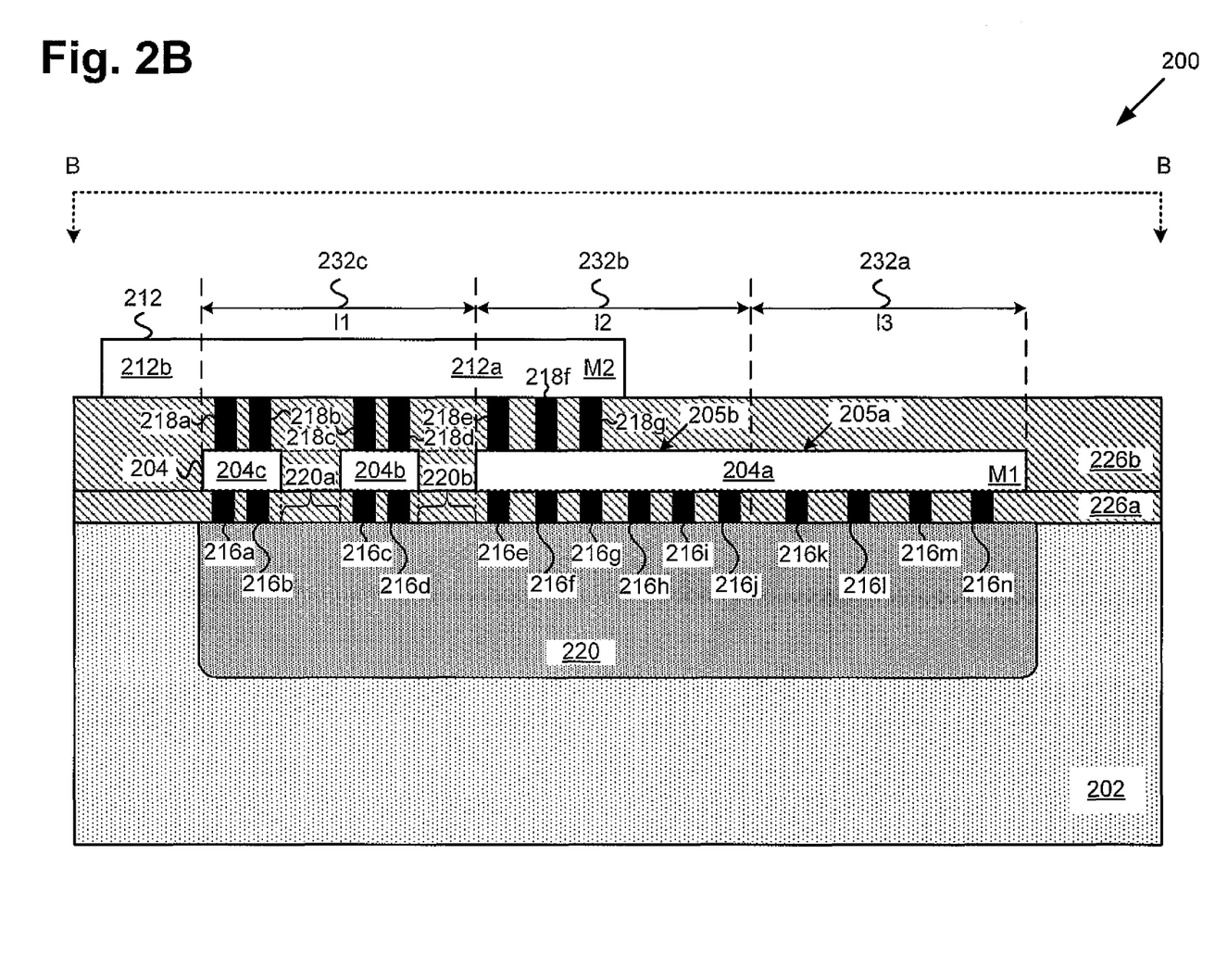
FIG. 2B illustrates a cross-sectional view of a portion of an exemplary semiconductor device having a metalization structure enabling reduced drain-to-source capacitance, in accordance with an implementation of the present application.

Turning to FIG. 2B, FIG. 2B illustrates a cross-sectional view of a portion of an exemplary semiconductor device having a metalization structure enabling reduced drain-to-source capacitance, in accordance with an implementation of the present application. In an implementation, FIG. 2B illustrates a cross-sectional view of semiconductor device 200 along line B-B in FIG. 2A. With similar numerals representing similar features in FIG. 2A, semiconductor device 200 in FIG. 2B includes source region 220 formed in semiconductor die 202, source finger electrode 204 in metal one (M1) layer, and common source rail 212 in metal two (M2) layer.

As illustrated in FIG. 2B, source finger electrode 204 includes main segment 204a and isolated segments 204b and 204c. Main segment 204a of source finger electrode 204 includes portion 205a and portion 205b, where portion 205a is narrower than portion 205b as shown in FIG. 2A. Isolated segments 204b and 204c are physically separated from main segment 204a. Source finger electrode 204, having main segment 204a and isolated segments 204b and 204c, is formed in metal one (M1) layer over dielectric layer 226a on semiconductor die 202. Portion 205a of main segment 204a, portion 205b of main segment 204a and the remaining portion of source finger electrode 204 having isolated segments 204b and 204c have lengths 232a, 232b and 232c, respectively, each of which is approximately one third of the total length of source finger electrode 204. In another implantation, portion 205a of main segment 204a, portion 205b of main segment 204a and the remaining portion of source finger electrode 204 having isolated segments 204b and 204c may have other appropriate lengths.

As illustrated in FIG. 2B, source finger electrode 204 is electrically coupled to source region 220 through source contacts 216. For example, isolated segment 204c is electrically coupled to source region 220 through source contacts 216a and 216b. Isolated segment 204b is electrically coupled to source region 220 through source contacts 216c and 216d. Portion 205b of main segment 204a is electrically coupled to source region 220 through source contacts 216e, 216f, 216g, 216h, 216i and 216j. Portion 205a of main segment 204a is electrically coupled to source region 220 through source contacts 216k, 216l, 216m and 216n. It is noted that the number of source contacts 216 used to electrically couple source finger electrode 204 to source region 220 is less than the number of contacts used to couple each source finger electrode 104 to a corresponding source region in semiconductor device 100 in FIG. 1, thereby reducing the on-state resistance of semiconductor device 200.

As illustrated in FIG. 2B, semiconductor device 200 also includes common source rail 212 having source contact finger 212a electrically and mechanically coupled to source runner 212b over dielectric layer 226b. Common source rail 212 is on a different metal plane (e.g., metal two (M2) layer) than source finger electrode 204 (e.g., metal one (M1) layer). Source contact finger 212a is situated over and extends approximately half way through source finger electrode 204. Source contact finger 212a electrically couples to isolated segments 204c and 204b and portion 205b of main segment 204a of source finger electrode 204 through conductive vias 218. For example, source contact finger 212a is electrically coupled to isolated segment 204c through conductive vias 218a and 218b. Source contact finger 212a is electrically coupled to isolated segment 204b through conductive vias 218c and 218d. Source contact finger 212a is also electrically coupled to portion 205b of main segment 204a through conductive vias 218e, 218f and 218g. Since common source rail 212 and source finger electrode 204 are formed on two different metal layers, the on-state resistance of semiconductor device 200 can be advantageously reduced. In addition, because isolated segments 204b and 204c are used as a means to connect source contact fingers 212a in metal two (M2) layer to source finger electrode 204 at the beginning portion thereof, bare active regions 220a and 220b are free of source contacts, metal one (M1) layer and conductive vias, thereby reducing the capacitive coupling to metal one (M1) regions in an adjacent drain finger electrode, such as portion 207a of main segment 206a of drain finger electrode 206 in FIG. 2A.

Figure 2C:
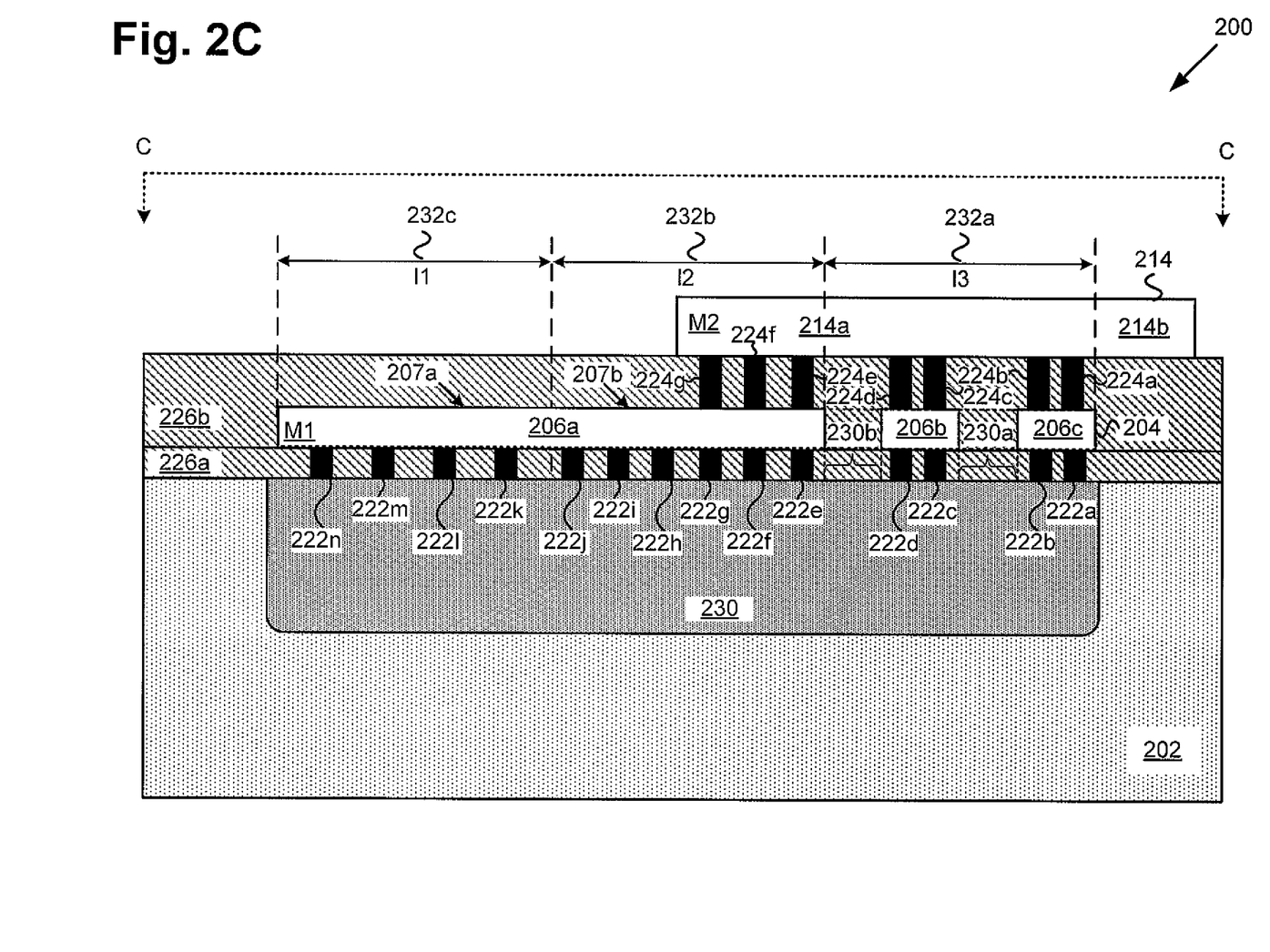
FIG. 2C illustrates a cross-sectional view of a portion of an exemplary semiconductor device having a metalization structure enabling reduced drain-to-source capacitance, in accordance with an implementation of the present application.

Turning to FIG. 2C, FIG. 2C illustrates a cross-sectional view of a portion of an exemplary semiconductor device having a metalization structure enabling reduced drain-to-source capacitance, in accordance with an implementation of the present application. In an implementation, FIG. 2C illustrates a cross-sectional view of semiconductor device 200 along line C-C in FIG. 2A. With similar numerals representing similar features in FIG. 2A, semiconductor device 200 in FIG. 2C includes drain region 230 formed in semiconductor die 202, drain finger electrode 206 in metal one (M1) layer, and common drain rail 214 in metal two (M2) layer.

As illustrated in FIG. 2C, drain finger electrode 206 includes main segment 206a and isolated segments 206b and 206c. Main segment 206a of drain finger electrode 206 includes portion 207a and portion 207b, where portion 207a is narrower than portion 207b as shown in FIG. 2A. Isolated segments 206b and 206c are physically separated from main segment 206a. Drain finger electrode 206, having main segment 206a and isolated segments 206b and 206c, is formed in metal one (M1) layer over dielectric layer 226a on semiconductor die 202. Portion 207a of main segment 206a, portion 207b of main segment 206a and the remaining portion of drain finger electrode 206 having isolated segments 206b and 206c have lengths 232c, 232b and 232a respectively, each of which is approximately one third of the total length of drain finger electrode 206. In another implantation, portion 207a of main segment 206a, portion 207b of main segment 206a and the remaining portion of drain finger electrode 206 having isolated segments 206b and 206c may have other appropriate lengths.

As illustrated in FIG. 2C, drain finger electrode 206 is electrically coupled to drain region 230 through drain contacts 222. For example, isolated segment 206c is electrically coupled to drain region 230 through drain contacts 222a and 222b. Isolated segment 206b is electrically coupled to drain region 230 through drain contacts 222c and 222d. Portion 207b of main segment 206a is electrically coupled to drain region 230 through drain contacts 222e, 222f, 222g, 222h, 222i and 222j. Portion 207a of main segment 206a is electrically coupled to drain region 230 through drain contacts 222k, 222l, 222m and 222n. It is noted that the number of drain contacts 222 used to electrically couple drain finger electrode 206 to drain region 230 is less than the number of contacts used to couple each drain finger electrode 106 to a corresponding drain region in semiconductor device 100 in FIG. 1, thereby reducing the on-state resistance of semiconductor device 200.

As illustrated in FIG. 2C, semiconductor device 200 also includes common drain rail 214 having drain contact finger 214a electrically and mechanically coupled to drain runner 214b over dielectric layer 226a. Common drain rail 214 is on a different metal plane (e.g., metal two (M2) layer) than drain finger electrode 206 (e.g., metal one (M1) layer). Drain contact finger 214a is situated over and extends approximately half way through drain finger electrode 206. Drain contact finger 214a electrically couples to isolated segments 206c and 206b and portion 207b of main segment 206a of drain finger electrode 206 through conductive vias 224. For example, drain contact finger 214a is electrically coupled to isolated segment 206c through conductive vias 224a and 224b. Drain contact finger 214a is electrically coupled to isolated segment 206b through conductive vias 224c and 224d. Drain contact finger 214a is electrically coupled to portion 207b of main segment 206a through conductive vias 224e, 224f and 224g. Since common drain rail 214 and drain finger electrode 206 are formed on two different metal layers, the on-state resistance of semiconductor device 200 can be advantageously reduced. In addition, because isolated segments 206b and 206c are used as a means to connect drain contact fingers 214a in metal two (M2) layer to drain finger electrode 206 at the beginning portion thereof, bare active regions 230a and 230b are free of drain contacts, metal one (M1) layer and conductive vias, thereby reducing the capacitive coupling to metal one (M1) regions in an adjacent source finger electrode, such as portion 205a of main segment 204a of source finger electrode 204 in FIG. 2A.

In the present implementation, semiconductor device 200 may be a transistor for example. It is noted that as used herein, the feature referred to as a "transistor" may correspond more generally to a variety of specific transistors or other semiconductor device implementations. In one implementation, for example, semiconductor device 200 may take the form of a radio frequency ("RF") switch in semiconductor on insulator ("SOI") structure or in bulk silicon, such as an SOI or a bulk silicon field-effect transistor (FET). As another example, semiconductor device 200 may be an insulated-gate FET (IGFET) or a heterostructure FET (HFET). In one implementation, semiconductor device 200 may take the form of a metal-insulator-semiconductor FET (MISFET), such as a metal-oxide-semiconductor FET (MOSFET). In other implementations, semiconductor device 200 may take the form of a schottky gated transistor, or a P-N junction gated transistor (JFET). In yet another implementation, semiconductor device 200 may take the form of a Schottky diode (not shown in FIGS. 2A-2C), for example through replacement of drain finger electrodes 206 with anode electrodes, replacement of the source finger electrodes 204 with cathode electrodes, and without gate finger electrodes 208 of FIG. 2A.

Figure 3:
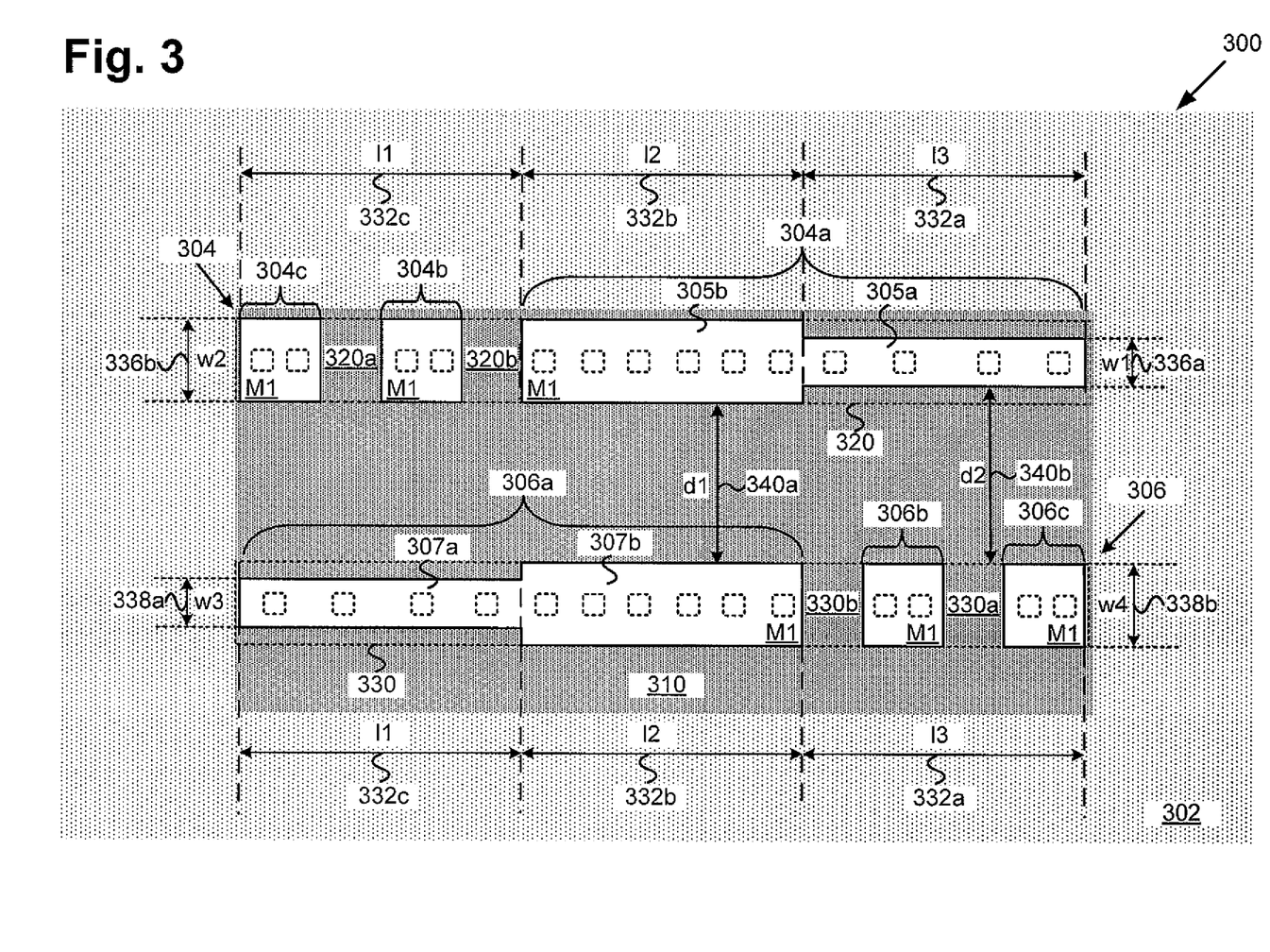
FIG. 3 illustrates a top plan view of a portion of an exemplary semiconductor device having a metalization structure enabling reduced drain-to-source capacitance, corresponding in general to the implementation shown in FIG. 2A.

Turning to FIG. 3, FIG. 3 illustrates a top plan view of a portion of an exemplary semiconductor device having a metalization structure enabling reduced drain-to-source capacitance, corresponding in general to the implementation shown in FIG. 2A. With similar numerals representing similar features in FIG. 2A, semiconductor device 300 in FIG. 3 includes source region 320 and drain region 330 in active region 310 of semiconductor die 302. Semiconductor device 300 also includes source finger electrode 304 over source region 320 and drain finger electrode 306 over drain region 330. Source finger electrode 304 and drain finger electrode 306 are substantially parallel to each other. It is noted that certain features (e.g., gate finger electrode 208, common source rail 212 and common drain rail 214 in FIG. 2A) of semiconductor device 300 are omitted from FIG. 3 for conceptual clarity. It is also noted that certain dimensions (e.g., distances 238a and 238b) are exaggerated in FIG. 3 for conceptual clarity.

As illustrated in FIG. 3, source finger electrode 304 is formed in metal one (M1) layer over semiconductor die 302, and electrically coupled to source region 320 through source contacts shown by dashed squares. Source finger electrode 304 includes main segment 304a and isolated segments 304b and 304c. Main segment 304a of source finger electrode 304 includes portion 305a having reduced width 336a and portion 305b having normal width 336b, where reduced width 336a is narrower than normal width 336b. In the present implementation, portion 305b of main segment 304a has a width of approximately 0.38 microns (i.e., $0.38*10^{-6}$ meters), and portion 305a of main segment 304a has a width of approximately 0.23 microns. In another implementation, reduced width 336a of portion 305a may be one third of normal width 336b of portion 305b. Portion 305a of main segment 304a has length 332a, while portion 305b of main segment 304a has length 332b. In the present implementation, lengths 332a and 332b are substantially equal. In another implementation, lengths 332a and 332b may have different values.

As illustrated in FIG. 3, because portion 305a of source finger electrode 304 has reduced width 336a, as compared to portion 305b of source finger electrode 304 having normal width 336b, the capacitive coupling between portion 305a of source finger electrode 304 and isolated segments 306b and 306c of drain finger electrode 306 is also substantially reduced, thereby resulting in a significant reduction in the off-state capacitance (Coff), while preserving a low or slightly increased on-state resistance (Ron).

As illustrated in FIG. 3, isolated segments 304b and 304c of source finger electrode 304 are physically separated from main segment 304a. For example, bare active region 320b is disposed between main segment 304a and isolated segment 304b, and is free of metalization of metal one (M1) layer. In addition, bare active region 320a is disposed between isolated segment 304b and isolated segment 304c, and is also free of metalization of metal one (M1) layer. Bare active regions 320a and 320b may be covered by one or more dielectric layer, such as dielectric layers 226a and 226b in FIG. 2B. As such, the remaining portion of source finger electrode 304, having isolated segments 304b and 304c, has length 332c. In the present implementation, length 332c is approximately equal to length 332a and length 332b, where each of lengths 332a, 332b and 332c is approximately equal to one third of the total length of source finger electrode 304. In another implementation, lengths 332a, 332b and 332c may have different values.

As illustrated in FIG. 3, drain finger electrode 306 is formed in metal one (M1) layer over semiconductor die 302, and electrically coupled to drain region 330 through drain contacts shown by dashed squares. Drain finger electrode 306 includes main segment 306a and isolated segments 306b and 306c. Main segment 306a of drain finger electrode 306 includes portion 307a having reduced width 338a and portion 307b having normal width 338b, where reduced width 338a is narrower than normal width 338b. In the present implementation, portion 307b of main segment 306a has a width of approximately 0.38 microns (i.e., $0.38*10^{-6}$ meters), and portion 307a of main segment 306a has a width of approximately 0.23 microns. In another implementation, reduced width 338a of portion 307a may be one third of normal width 338b of portion 307b. Portion 307a of main segment 306a has length 332c, while portion 307b of main segment 306a has length 332b. In the present implementation, lengths 332b and 332c are substantially equal. In another implementation, lengths 332b and 332c may have different values.

As illustrated in FIG. 3, because portion 307a of drain finger electrode 306 has reduced width 338a, as compared to portion 307b of drain finger electrode 306 having normal width 338b, the capacitive coupling between portion 307a of drain finger electrode 306 and isolated segments 304b and 304c of source finger electrode 304 is also substantially reduced, thereby resulting in a significant reduction in the off-state capacitance (Coff), while preserving a low or slightly increased on-state resistance (Ron).

As further illustrated in FIG. 3, isolated segments 306b and 306c of drain finger electrode 306 are physically separated from main segment 306a. For example, bare active region 330b is disposed between main segment 306a and isolated segment 306b, and is free of metalization of metal one (M1) layer. In addition, bare active region 330a is disposed between isolated segment 306b and isolated segment 306c, and is also free of metalization of metal one (M1) layer. Bare active regions 330a and 330b may be covered by one or more dielectric layers, such as dielectric layers 226a and 226b in FIG. 2C. The remaining portion of drain finger electrode 306, having isolated segments 306b and 306c, has length 332a. In the present implementation, length 332a is approximately equal to length 332b and length 332c, where each of lengths 332a, 332b and 332c is approximately equal to one third of the total length of drain finger electrode 306. In another implementation, lengths 332a, 332b and 332c may have different values.

As shown in FIG. 3, source finger electrode 304 is formed laterally adjacent to drain finger electrode 306. Distance 340a is a distance between opposing sides of portion 305b of main segment 304a and portion 307b of main segment 306a, for example. Distance 340b is a distance between opposing sides of portion 305a of main segment 304a and isolated segment 306b or 306c, for example. As illustrated in FIG. 3, as portion 305a of source finger electrode 304 is laid out across from isolated segments 306b and 306c of drain finger electrode 306, the drain-to-source capacitive coupling, such as off-state parasitic coupling, is substantially reduced due to reduced width 336a of portion 305a of source finger electrode 304, and also the presence of bare active regions 330a and 330b not covered by drain finger electrode 306. As illustrated in FIG. 3, since portion 305a of source finger electrode 304 is displaced at distance 340b away from isolated segments 306b and 306c, the capacitive coupling between isolated segment 306b and portion 305a, and between isolated segment 306c and portion 305a, is substantially reduced, as compared to the capacitive coupling between portion 305b of source finger electrode 304 and portion 307b of drain finger electrode 306 separated by distance 340a.

In the present implementation, because isolated segments 306b and 306c are used at the beginning portion of drain finger electrode 306, the capacitive coupled between portion 305a and bare active regions 330a and 330b is substantially minimized. Since bare active regions 330a and 330b are free of contacts, metal one (M1) layer and conductive vias, no capacitive coupling exists between portion 305a of source finger electrode 304 and bare active regions 330a and 330b. For example, bare active region 330a between isolated segments 306b and 306c is free of conductive material of metal one (M1) layer, as isolated segments 306b and 306c are separated by one or more dielectric layers, such as dielectric layers 226a and 226b in FIG. 2C. Bare active region 330b between isolated segment 306b and main segment 306a is also free of conductive material of metal one (M1) layer, as isolated segment 306b and main segment 306a are separated by one or more dielectric layers, such as dielectric layers 226a and 226b in FIG. 2C. Thus, the drain-to-source coupling between the tip portion (i.e., portion 305a) of source finger electrode 304 and the beginning portion (i.e., isolated segments 306b and 306c) of drain finger electrode 306 is substantially minimized. Similarly, the drain-to-source capacitive coupling at the beginning portion (i.e., isolated segments 304b and 304c) of source finger electrode 304 and the tip portion (i.e., portion 307a) of drain finger electrode 306 is also substantially minimized for similar reasons stated above.

Implementations of the present application utilize improved metalization of source and drain finger electrodes to achieve a lower Ron*Coff product. According to an implementation of the present application, each of the drain and source finger electrodes includes at least one isolated segment and a main segment, where the main segment has a portion with a normal width and another portion with a reduced width. By segmenting a source or drain finger electrode into a main segment and one or more isolated segments, implementations of the present application result in bare active regions where no contact, metal one (M1) layer or conductive via is formed thereabove, thereby substantially eliminating capacitive coupling in the bare active regions. According to an implementation of the present application, a large number of metal contacts between source finger electrodes and corresponding source regions and between drain finger electrodes and corresponding drain regions are removed to reduce the number of contacts, thereby improving the on-state resistance (Ron).

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present application.

The invention claimed is:

1. A semiconductor device comprising:
   a source region in a semiconductor die;
   a drain region in said semiconductor die;
   a source finger electrode located over the source region, wherein said source finger electrode comprises at least one isolated segment and a main segment having a first portion and a second portion that is narrower than said first portion, wherein the at least one isolated segment and the main segment of the source finger electrode are physically separated segments of a first metal layer; and
   a plurality of source contacts that electrically couple the at least one isolated segment and the main segment of the source finger electrode to the source region.

2. The semiconductor device of claim 1 further comprising:
   a common source rail located over the source finger electrode in a second metal layer; and
   a plurality of conductive vias that electrically couple the at least one isolated segment and the main segment of the source finger electrode to the common source rail.

3. The semiconductor device of claim 2, wherein the common source rail extends over the isolated segments and the first portion of the main segment, but not the second portion of the main segment.

4. The semiconductor device of claim 3, wherein the common source rail extends approximately halfway across the source finger electrode.

5. The semiconductor device of claim 2, wherein the common source rail has the first width.

6. The semiconductor device of claim 1 further comprising:
   a drain finger electrode located over the drain region, wherein said drain finger electrode comprises at least one isolated segment and a main segment having a first portion and a second portion that is narrower than said first portion, wherein the main segment of the drain finger electrode and the at least one isolated segment of the drain finger electrode are physically separated segments of the first metal layer; and
   a plurality of drain contacts that electrically couple the at least one isolated segment of the drain finger electrode and the main segment of the drain finger electrode to the drain region.

7. The semiconductor device of claim 6 further comprising:
   a common drain rail located over the drain finger electrode in a second metal layer; and
   a plurality of conductive vias that electrically couple the at least one isolated segment of the drain finger electrode and the main segment of the drain finger electrode to the common drain rail.

8. The semiconductor device of claim 6 further comprising:
   a gate located between the source region and the drain region;
   wherein said second portion of said main segment of said drain finger electrode is laid out across the gate from said at least one isolated segment of said source finger electrode.

9. The semiconductor device of claim 8, wherein said second portion of the main segment of the source finger electrode is laid out across the gate from said at least one isolated segment of said drain finger electrode.

10. The semiconductor device of claim 1, wherein the at least one isolated segment has the first width.

11. The semiconductor device of claim 1, wherein the isolated segment has a first length, the first portion of the main segment has a second length and the second portion of the main segment has a third length, wherein the first, second and third lengths are approximately equal.

12. The semiconductor device of claim 1, wherein the first portion of the main segment is located between the second portion of the main segment and the at least one isolated segment.

13. A transistor comprising:
a plurality of source regions and a plurality of drain regions in a semiconductor die;
source finger electrodes electrically coupled to the source regions and interdigitated with drain finger electrodes electrically coupled to the source regions;
wherein at least one of said source finger electrodes includes at least one isolated source finger electrode segment and a main source finger electrode segment, which are physically separated segments of a first metal layer; and
wherein at least one of said drain finger electrodes includes at least one isolated drain finger electrode segment and a main drain finger electrode segment, which are physically separated segments of the first metal layer.

14. The transistor of claim 13, wherein said main source finger electrode segment comprises a first portion and a second portion narrower than said first portion.

15. The transistor of claim 13 wherein said main drain finger electrode segment comprises a first portion and a second portion narrower than said first portion.

16. The transistor of claim 15 wherein said second portion of said main drain finger electrode segment is laid out across from said at least one isolated source finger electrode segment.

17. The transistor of claim 13 wherein a common source rail is electrically coupled to said at least one isolated source finger electrode segment through conductive vias.

18. The transistor of claim 17 wherein the common source rail is formed in a metal two (M2) layer.

19. The transistor of claim 17 wherein a common drain rail is electrically coupled to said at least one isolated drain finger electrode segment through conductive vias.

20. The transistor of claim 19 wherein the common source rail and the common drain rail are formed in a metal two (M2) layer.

* * * * *